(12) United States Patent
Chen

(10) Patent No.: US 8,084,682 B2
(45) Date of Patent: Dec. 27, 2011

(54) MULTIPLE BAND GAPPED CADMIUM TELLURIDE PHOTOVOLTAIC DEVICES AND PROCESS FOR MAKING THE SAME

(76) Inventor: Yung-Tin Chen, Santa Clara, CA (US)

( * ) Notice: Subject to any disclaimer, the term of this patent is extended or adjusted under 35 U.S.C. 154(b) by 409 days.

(21) Appl. No.: 12/381,166

(22) Filed: Mar. 9, 2009

(65) Prior Publication Data

US 2010/0180935 A1    Jul. 22, 2010

Related U.S. Application Data

(60) Provisional application No. 61/205,560, filed on Jan. 21, 2009.

(51) Int. Cl.
*H01L 31/00* (2006.01)
(52) U.S. Cl. .................. 136/255; 136/260; 136/264
(58) Field of Classification Search .................. None
See application file for complete search history.

(56) References Cited

U.S. PATENT DOCUMENTS

| 4,753,684 A | 6/1988 | Ondris et al. |
| 5,393,675 A | 2/1995 | Compaan |
| 2009/0235986 A1* | 9/2009 | Hotz et al. ............... 136/260 |

* cited by examiner

*Primary Examiner* — Alexa Neckel
*Assistant Examiner* — Shannon Gardner
(74) *Attorney, Agent, or Firm* — Bing K. Yen; G. Marlin Knight

(57) ABSTRACT

A heterojunction photovoltaic device for the production of electrical energy in response to the incident light includes an optically transparent substrate, a front contact formed of an transparent conductive oxide for collecting light generated charge carriers, an n-type window layer formed of cadmium sulfide or zinc sulfide, a p-type absorber structure disposed on the window layer, thereby forming a rectification junction therebetween, and a back contact comprising at least one metal layer. The p-type absorber structure has a plurality of p-type absorber layers in contiguous contact. Each absorber layer contains cadmium as a principal constituent and has a different composition and a different band gap energy. The first absorber layer is in contiguous contact with the n-type window layer. The band gap energy progressively decreases from the first absorber layer to the last absorber layer in the p-type absorber structure.

6 Claims, 2 Drawing Sheets

LIGHT

MULTIPLE BAND GAPPED CADMIUM TELLURIDE PHOTOVOLTAIC DEVICES AND PROCESS FOR MAKING THE SAME

RELATED APPLICATIONS

The present application is a continuation-in-part application of U.S. provisional patent application Ser. No. 61/205,560, filed Jan. 21, 2009, for HYBRID SPUTTERING AND VAPOR TRANSPORT DEPOSITION PROCESS FOR MULTIPLE BAND-GAPPED CADMIUM TELLURIDE PHOTOVOLTAIC DEVICES, by Yung-Tin Chen, included herein by reference and for which benefit of the priority date is hereby claimed.

FIELD OF THE INVENTION

The present invention relates to a cadmium telluride photovoltaic device having multiple absorber layers with different band gap energies to improve photo conversion efficiency.

BACKGROUND OF THE INVENTION

Photovoltaic technology offers great potential as an alternative source of electrical energy. Among various types of thin film solar cell technologies, cadmium telluride (CdTe) semiconductor based solar cells have emerged to be one of the leading candidates for large scale, low cost photovoltaic power. The band gap energy of CdTe (1.45-1.5 eV) is well suited for the terrestrial solar spectrum. A few micrometers (μm) of CdTe are sufficient to absorb most of the incident sunlight because of the high optical absorption coefficient thereof. As such, a carrier diffusion length of the order of one micrometer is sufficient to allow all the generated carriers to be collected at the contact electrodes, which significantly relaxes the material quality requirements such as minimum grain size. This is in direct contrast with crystalline silicon solar cells, which require several hundreds of micrometers of silicon owing to the indirect band gap structure thereof. Cadmium telluride, which melts congruently, is the only stable compound between cadmium and tellurium. This advantageous property permits deposition of near stoichiometric CdTe films by various methods including chemical vapor deposition, sputter deposition and close spaced sublimation (CSS). Advances in CdTe technology have led to cell efficiencies of up to 16.5% demonstrated by the researchers from National Renewable Energy Laboratory (NREL).

FIG. 1 is a schematic cross-sectional view of a conventional CdTe thin film photovoltaic device, which includes a glass substrate 21 through which radiant energy or light enters the device; a layer of front contact 23 made of a transparent conductive oxide (TCO) such as fluorine doped tin oxide ($SnO_2$:F) disposed on the substrate 21; an n-type cadmium sulfide (CdS) window layer 25 disposed on the front contact layer 23; a p-type CdTe absorber layer 27 deposited contiguously onto the CdS window layer 25, thereby forming a heterogeneous rectifying junction therebetween; and a layer of back contact 29 made of copper and gold bilayers disposed on the CdTe absorber layer 27.

The photovoltaic device of FIG. 1 has a "superstrate" configuration because the glass substrate 21 is actually on top facing the sun light during operation. The glass substrate 21 is not only used as supporting structure during manufacturing and operation but also as window for transmitting light and as part of the encapsulation. Soda-lime glass, which is limited to a maximum processing temperature of 500° C., is a commonly used substrate material because of its low cost. An alternative substrate material is borosilicate glass which can be processed up to a higher maximum temperature of 600° C. Compared with soda-lime glass, borosilicate glass has a higher transparency, thereby improving current collection, a better matched thermal expansion coefficient to CdTe and fewer impurities which may adversely affect the electrical properties of solar cells.

In fabricating the photovoltaic device illustrated in FIG. 1, the front contact 23 made of a TCO material is first deposited onto the glass substrate 21 by physical vapor deposition (PVD) or chemical vapor deposition (CVD). The TCO of the front contact 23 collects light generated charge carriers while permitting sunlight to pass therethrough. The thickness of the TCO is thus a trade-off between high optical transparency and low sheet resistance. The TCO layer is normally doped to decrease the sheet resistance and is thick enough to form a barrier against diffusion of unwanted species from the glass substrate 21 during operation and high temperature fabrication process. The most commonly used front contact material for CdTe solar cells is fluorine doped tin oxide ($SnO_2$:F) because soda-lime glass pre-coated with $SnO_2$:F is readily available from commercial glass suppliers. The sheet resistance of $SnO_2$:F is sufficiently low enough as not to hinder the solar cell performance. However, $SnO_2$:F has a relatively low optical transmission coefficient of approximately 80%, which limits the short circuit current ($J_{sc}$) of the solar cell. Alternative TCO materials such as cadmium stannate ($CdSnO_4$) have also been employed for the front contact 23 to overcome the low optical transmission problem associated with $SnO_2$:F.

An optional secondary TCO layer (not shown) with higher sheet resistance than that of the TCO layer used for the front contact 23 may be inserted between the window layer 25 and the front contact 23. This secondary TCO layer formed on the front contact is known as high-resistance TCO (HRT). Undoped zinc stannate ($ZnSnO_4$), zinc oxide (ZnO) and $SnO_2$ have been employed as the HRT layer which permits thinning of the CdS window layer 25, thereby increasing the quantum efficiency of the solar cell in the blue region. The HRT layer may also improve the solar cell efficiency by forming a barrier against diffusion of unwanted species from the glass substrate 21 and the front contact 23 to the CdS window layer 25.

Following the deposition of the front contact 23 onto the glass substrate 21 of the photovoltaic device illustrated in FIG. 1, a first mechanical or laser scribing step is applied over the entire width of the substrate 21 to pattern the front contact 23 and to isolate individual cells. The cuts have to be as narrow as possible (100 μm range) and are spaced apart by 5-10 mm.

After scribing the front contact layer 23, the n-type CdS window layer 25 having a thickness of 80-300 nm is deposited onto the front contact layer 23 by various methods including sputter deposition, chemical bath deposition and close spaced sublimation (CSS). Since CdS has a band gap energy of approximately 2.4 eV, high energy (blue) photons may be absorbed by the CdS window layer 25 before reaching the CdTe absorber layer 27. Photons absorbed by the CdS window layer 25 do not contribute to the current generation of the device. Consequently, the thickness of the CdS window layer 25 should be as thin as possible to minimize this loss. The thinning of the CdS window layer 25, however, may lead to pin-hole formation, which may cause a shunt between the front contact 23 and the CdTe absorber layer 27. This is further complicated by the fact that some CdS is consumed during the subsequent CdTe deposition and post-deposition annealing described below.

According to the device illustrated in FIG. 1, the p-type CdTe absorber layer 27 having a thickness of 2-8 μm is then deposited onto the n-type CdS window layer 25, thereby forming a heterogeneous p-n junction. There has been a trend to minimize the thickness of the CdTe absorber layer 27 in order to conserve the rare element tellurium (Te), because it is thought that there may not be adequate Te supply to fabricate enough CdTe photovoltaic devices to meet global demand. Cadmium telluride has a direct band gap energy of 1.45-1.5 eV, which is well suited for the terrestrial solar spectrum for a single junction solar cell. Moreover, the direct band gap structure gives CdTe a high optical absorption coefficient of $5 \times 10^4$ $cm^{-1}$ in visible light spectrum. One micrometer of CdTe can absorb 92% of incident sunlight.

While there are a multitude of methods for depositing the CdTe absorber layer 27, close spaced sublimation (CSS) and variants thereof are the preferred methods for depositing CdTe in manufacturing of CdTe photovoltaic device. In the CSS method, a substantially flat substrate is positioned in parallel with a CdTe source plate along a plane spaced apart therefrom in a rough vacuum environment. The substrate and the source plate are heated to about 500° C. with the substrate temperature being held at a slightly lower temperature, which drives the condensation of CdTe vapor on the substrate surface and thus CdTe film formation on the same.

After the deposition of the CdTe absorber layer 27, a layer of cadmium chloride ($CdCl_2$) is deposited onto the surface thereof, which is then followed by a 20 to 30 minute annealing at about 450° C. in air. The $CdCl_2$ may be deposited using a vacuum deposition technique or a colloidal solution containing a mixture of $CdCl_2$ particles and methanol. The $CdCl_2$ treatment can also be applied during the deposition of the CdTe absorber layer 27. The need for the $CdCl_2$ treatment arises from the difficulties in doping CdTe with high concentration of foreign dopants because of the ability of native defects in CdTe to form complexes, which can act as doping centers themselves and potentially compensate for the impurity doping. While the precise mechanisms of $CdCl_2$ treatment are still not fully clear, it is generally believed that a chlorine (Cl) atom from $CdCl_2$ substituting a Te atom acts as a shallow donor, thereby increasing p-type doping of CdTe.

Following the $CdCl_2$ treatment, a second mechanical or laser scribing step is applied over the entire width of the substrate 21 to pattern the interconnect between adjacent cells of the photovoltaic device illustrated in FIG. 1. The cuts stop on the front contact 23 and are spaced apart by 5-10 mm depending on the design.

After the second scribing step to pattern the interconnect between adjacent cells, a layer of back contact 29 is deposited onto the CdTe absorber layer 27. In order to establish a low resistive ohmic contact with the p-type CdTe semiconductor, the work function of the metallic contact material needs to exceed that of the semiconductor. However, the p-type CdTe has an extremely high work function of 5.8 eV owing to high electron affinity thereof, which essentially prevents the formation of a low resistive CdTe/metal contact for all known metals. If the work function of the contact does not exceed that of the p-type CdTe, a Schottky barrier would form at the interface which would hinder the carrier movement across the same, thereby decreasing the device efficiency.

There are several schemes developed to minimize the contact barrier at the interface between the back contact 29 and the CdTe absorber layer 27. The implementation of these schemes is the primary reason for fabrication CdTe photovoltaic device in the "superstrate" configuration. One approach to overcome the above mentioned problem is to minimize the width of the barrier by increasing the dopant concentration of CdTe at the contact/CdTe interface, thereby permitting carriers to tunnel therethrough. The dopant concentration may be increased by selectively etching Cd to form a Te-rich surface. Another approach is to form a thin, intermediate layer such as copper telluride ($Cu_xTe$) and copper doped zinc telluride (ZnTe:Cu) in between the contact and CdTe. As such, the deposition of the back contact 29 is often implemented as a bilayer system: a thin layer of copper is first deposited on the CdTe surface to form copper telluride and then followed by the deposition of a thicker conductive material, such as gold, titanium and graphite-silver paste.

Following the deposition of the back contact 29, a third mechanical or laser scribing step is applied over the entire width of the substrate 21 to pattern the back contact 29, thereby completing the photovoltaic device illustrated in FIG. 1.

Much of the development effort in CdTe solar cell heretofore has been focused on the $CdCl_2$ treatment and the back contact schemes described above. While the band gap energy of CdTe is considered to be nearly ideal for a solar cell with a single absorber layer, CdTe does not absorb photons with energies less than its band gap energy of 1.45 eV. Unlike crystalline silicon and copper indium gallium selenide (CIGS) photovoltaic devices which have lower band gap energies of about 1.1 eV to 1.2 eV and higher conversion efficiencies, CdTe photovoltaic device cannot effectively convert the red and near infrared part of the sunlight into electrical energy.

SUMMARY OF THE INVENTION

The present invention addresses the drawback of the prior art CdTe photovoltaic device noted above and provides a CdTe photovoltaic device which absorbs photons from the red and near infrared part of the solar spectrum for improving conversion efficiency.

Accordingly, an object of the present invention is to provide a high efficiency CdTe photovoltaic device having multiple absorber layers designed for specific parts of the solar spectrum.

Another object of the present invention is to provide a method for fabricating such a device.

Therefore, according to one aspect of the present invention, A heterojunction photovoltaic device for the production of electrical energy in response to the incident light comprises an optically transparent substrate, a front contact formed of an transparent conductive oxide disposed on the substrate for collecting light generated charge carriers, an n-type window layer formed of cadmium sulfide or zinc sulfide disposed on the front contact, a p-type absorber structure disposed on the window layer, thereby forming a rectification junction therebetween, and a back contact disposed on the absorber structure comprising at least one metal layer. The p-type absorber structure has a plurality of p-type absorber layers in contiguous contact. Each absorber layer contains cadmium as a principal constituent and has a different composition and a different band gap energy. The first absorber layer is in contiguous contact with the n-type window layer. The band gap energy progressively decreases from the first absorber layer to the last absorber layer in the p-type absorber structure.

In a preferred embodiment, the p-type absorber structure comprises three absorber layers. The first absorber layer is selected from the group consisting of cadmium selenide, cadmium magnesium telluride, cadmium manganese telluride and cadmium zinc telluride. The second absorber layer is cadmium telluride. The third absorber layer is cadmium mercury telluride.

To achieve the above and other objects, according to another aspect of the present invention, a method for fabricating a heterojunction photovoltaic device having three p-type absorber layers in contiguous contact, in which each layer has a different composition and contains cadmium as a principal constituent, includes the steps of providing an optically transparent substrate, depositing a doped transparent conductive oxide layer onto the substrate by sputter deposition to form a front contact, depositing an n-type window layer onto the doped transparent conductive oxide layer by sputter deposition at a temperature in the range of from about 250° C. to about 450° C., depositing a first p-type absorber layer onto the window layer by sputter deposition at a temperature in the range of from about 250° C. to about 450° C., depositing a second p-type absorber layer onto the first absorber layer by sputter deposition at a temperature in the range of from about 250° C. to about 450° C. or a physical vapor deposition method, depositing a third p-type absorber layer onto the second absorber layer by sputter deposition at a temperature in the range of from about 250° C. to about 450° C., depositing a thin $CdCl_2$ layer onto the third absorber layer by sputtering, annealing the $CdCl_2$ layer and the absorber layers at a temperature in the range of from about 380° C. to about 450° C. to diffuse chlorine from the $CdCl_2$ layer into the absorber layers and depositing one or more layers of conductive metal onto the $CdCl_2$ layer to form a back contact.

The objects, features, aspects, and advantages of the present invention are readily apparent from the following detailed description of the preferred embodiments for carrying out the invention when taken in connection with the accompanying drawings.

DETAILED DESCRIPTION OF THE INVENTION

The present invention overcomes the inability of the conventional CdTe photovoltaic device to absorb low energy photons by the spectrum splitting or multi band gap approach, wherein multiple absorber layers with different band gap energies are employed to absorb photons from a wider range of the solar spectrum. Compared with the conventional CdTe absorber having a band gap energy of 1.45-1.5 eV, an absorber layer with a higher band gap energy can convert high energy photons to higher open circuit voltage ($V_{oc}$), while an absorber with a lower band gap energy can absorb lower energy photons and allow more efficient use of the solar spectrum.

Figure 1:
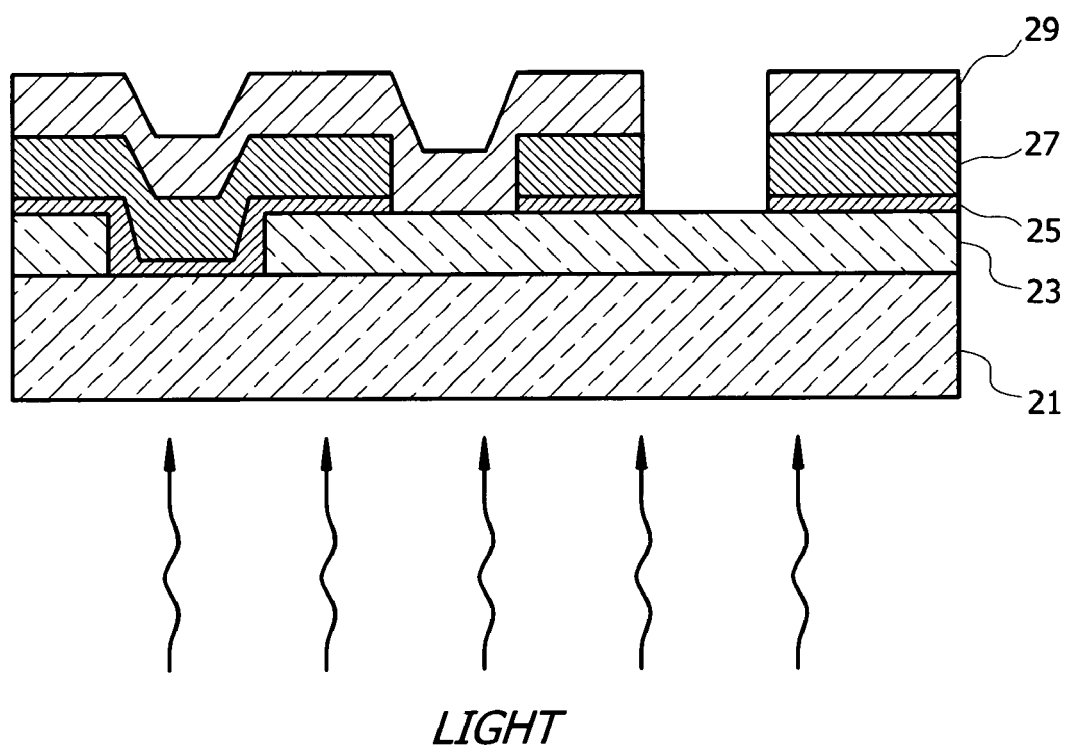
FIG. 1 is a cross sectional schematic view of a conventional CdTe photovoltaic device in the superstrate configuration.
Figure 2:
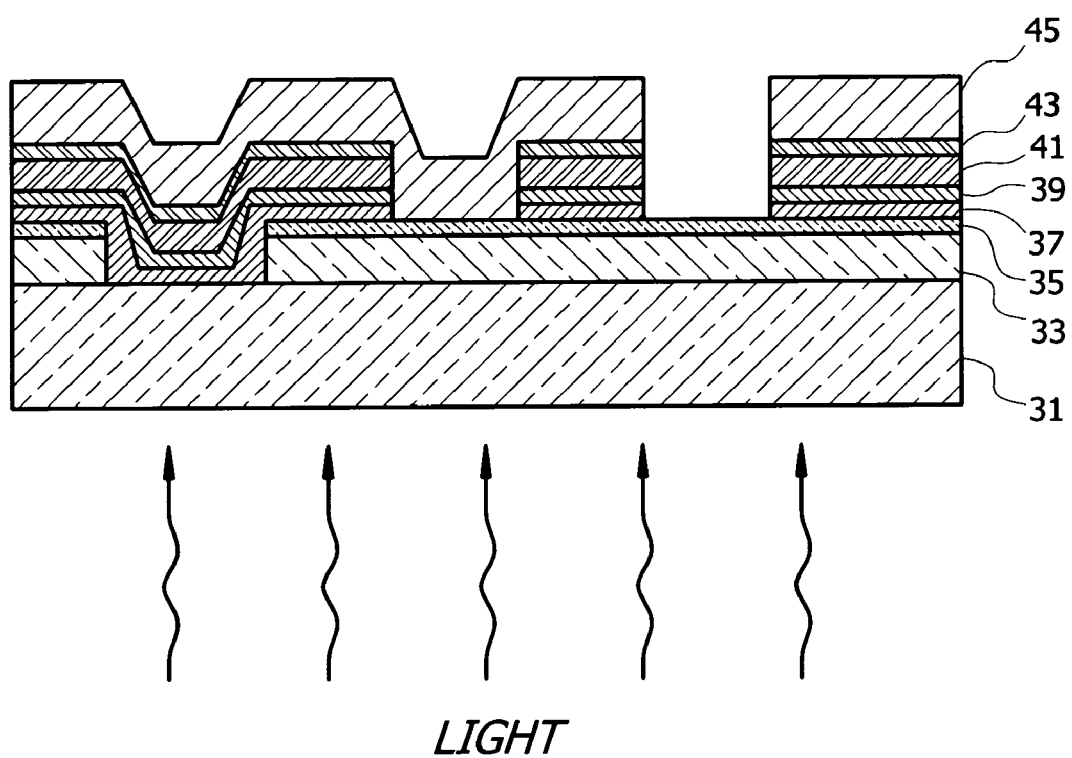
FIG. 2 is a cross sectional schematic view of an embodiment of a device according to the present invention.

The preferred embodiment of the present invention as applied to a CdTe photovoltaic device having three absorber layers will now be described with reference to FIG. 2. Referring now to FIG. 2, the illustrated device has an optically transparent dielectric substrate 31, through which radiant energy or sunlight enters the device; a layer of optically transparent front contact 33 made of a TCO material disposed on the substrate 31 for collecting light generated charge carriers; a layer of secondary TCO layer 35 having higher electrical resistivity disposed on the front contact 33; an n-type cadmium sulfide (CdS) or cadmium zinc sulfide (CdZnS) window layer 37 disposed on the secondary TCO layer 35; a p-type, Cd-containing first absorber layer 39 having a high band gap energy, preferably 1.7 eV to 1.8 eV, disposed on the window layer 37, thereby forming a rectifying junction therebetween; a p-type CdTe second absorber layer 41 having a intermediate band gap energy, preferably 1.4 eV to 1.5 eV, disposed on the first absorber layer 39; a p-type, Cd-containing third absorber layer 43 having a low band gap energy, preferably 1.0 eV to 1.2 eV, disposed on the second absorber layer 41; and a back contact 45 disposed on the third absorber layer 43 for collecting light generated charge carriers.

The device illustrated in FIG. 2 is constructed in the "superstrate" configuration, wherein the substrate 31 acts as the input window for receiving sunlight and provides support for the device layers 33-45 during fabrication and operation. The transparent dielectric substrate 31, preferably made of soda-lime or borosilicate glass, also provides protection for the device from impact and elements while allowing maximum transmission of sunlight.

The function of the front contact 33 is to collect light generated charge carriers while allowing sunlight to pass therethrough. As such, the front contact 33 is preferably a doped TCO material, such as fluorine doped tin oxide ($SnO_2$:F) and aluminum doped zinc oxide (ZnO:Al), and is sputter-deposited onto the substrate 31. The thickness of front contact 33 is between 0.5 µm and 2 µm, depending on the sheet resistance and transmission requirements.

The secondary TCO layer 35, also known as high-resistance TCO (HRT), is made of undoped zinc stannate ($ZnSnO_4$), zinc oxide (ZnO) or $SnO_2$ and can be deposited onto the front contact 33 by various methods including sputter deposition, evaporation and chemical vapor deposition (CVD). The use of HRT layer permits thinning of the window layer 37, thereby increasing the quantum efficiency of the photovoltaic device in the blue part of the solar spectrum. The preferred thickness of the secondary TCO layer 35 ranges from about 50 nm to about 150 nm.

An appropriate material for the n-type window layer 37 of the device illustrated in FIG. 2 is CdS which has a band gap energy of 2.4 eV. Cadmium sulfide may be deposited by various methods including sputter deposition, chemical bath deposition and close spaced sublimation (CSS). Photons with energy greater than the band gap energy of CdS (2.4 eV) may be absorbed by CdS before reaching the absorber layers 39-43. Since these photons absorbed by the CdS window layer 37 do not generate charge carriers, it is desirable that the CdS thickness be as thin as possible to minimize this absorption loss. However, the thinning of the CdS window layer 25, may lead to pin-hole formation, which may cause a shunt between the front contact 33 and the first absorber layer 39. This is further complicated by the fact that some CdS is consumed during the subsequent absorber deposition and post-deposition annealing. Moreover, a charge depletion region is formed at the heterogeneous junction of the n-type CdS and the p-type absorber, which may extend all the way through the window layer 37 if CdS is very thin or not too heavily doped. Therefore, there is a tradeoff between absorption loss and depletion loss in optimizing the CdS thickness. The preferred thickness for the CdS window layer 37 ranges from about 80 nm to about 300 nm.

Another suitable material for the n-type window layer 37 of the device in FIG. 2 according to the present invention is $Cd_{1-x}Zn_xS$, where x ranges from more than zero to no more than one. Inclusion of zinc in place of some of the cadmium can advantageously increase the band gap energy. Since a semiconductor does not absorb photons with lesser energy than the band gap energy thereof, the use $Cd_{1-x}Zn_xS$ with higher band gap energies for the window layer 37 permits more photons pass therethrough, thereby decreasing the absorption loss. It is thus desired that the band gap energy of the $Cd_{1-x}Zn_xS$ window is 2.4 eV or more. An appropriate thickness of $Cd_{1-x}Zn_xS$ ranges from about 80 nm to about 300 nm.

The desired multi band gap approach according to the present invention is achieved in the three layer p-type absorber structure with each absorber layer being composed of a different semiconductor compound. The three p-type absorber layers 39-43 are in contiguous contact and are disposed in series optically as incident light enters the first absorber layer 39 and passes therethrough to enter the second absorber layer 41, etc., until it has passed through all three layers 39-43 or is entirely absorbed. The first absorber layer 39, i.e. the layer that first receives incident light, has a band gap energy higher than 1.5 eV, preferably 1.7 eV to 1.8 eV, for absorbing photons with higher energies. The second absorber layer 41, which is the thickest of the three absorber layers 39-43 and absorbs most of the incident light, has a narrower band gap energy optimized for the solar spectrum, preferably 1.4 eV to 1.5 eV. The third absorber layer 43 has the narrowest band gap energy of about 1.0 eV to about 1.2 eV for absorbing light from the red and near infrared part of the solar spectrum, thereby permitting more efficient use of the solar spectrum.

An appropriate material for the p-type first absorber layer 39 with a relatively higher band gap energy is cadmium magnesium telluride, $Cd_{1-y}Mg_yTe$, where y ranges from more than zero to less than one, preferably from 0.05 to 0.20. Substitution of magnesium for some of the cadmium atoms increases the band gap energy of $Cd_{1-y}Mg_yTe$ to more than 1.5 eV for the CdTe binary compound. Therefore, the preferred band gap energy of 1.7 eV to 1.8 eV for the first absorber layer 39 can be attained by substituting magnesium for 5 to 20% of the cadmium atoms in the film. Manganese (Mn) and zinc (Zn) may also replace some of the cadmium atoms of cadmium telluride to increase the band gap energy to the desired level. As such, $Cd_{1-z}Mn_zTe$ and $Cd_{1-z}Zn_zTe$, where z ranges from zero to less than one, preferably from 0.05 to 0.20, may also be employed for the first absorber layer 39. Another suitable material for the first absorber layer 39 is cadmium selenide (CdSe) which has a band gap energy of 1.7 eV. The preferred thickness of the first absorber layer 39 is in the range of about 5 nm to 200 nm. Various methods may be used to deposit $Cd_{1-y}Mg_yTe$ and CdSe including sputter deposition, chemical bath and CSS. The preferred method of depositing $Cd_{1-y}Mg_yTe$, $Cd_{1-z}Mn_zTe$, $Cd_{1-z}Zn_zTe$ and CdSe according to the present invention is by pulsed DC magnetron sputtering or RF magnetron sputtering, wherein the substrate temperature is preferably held at about 200° C. to 450° C. during the sputter deposition process.

The second absorber layer 41 is formed of p-type CdTe which has a band gap energy of about 1.45 eV to 1.5 eV. Most of the incident sunlight is absorbed by the second absorber layer 41 which has a preferred thickness of about 2 to 6 μm. The CdTe absorber can be deposited by a multitude of methods including CSS, sputter deposition and chemical bath deposition. Sputter deposition of CdTe is carried out at temperatures no more than about 500° C., preferably 250° C. to 450° C.

Close spaced sublimation (CSS) and variants thereof are particularly advantageous methods of depositing the relatively thick CdTe absorber. Deposition methods based on sublimation of CdTe generally have deposition rates that are 10 to 20 times higher than that of sputter deposition. In the CSS process according to the present invention the CdTe source plate and the substrate for film deposition are heated to about 500° C. with the substrate temperature being held at a slightly lower temperature, which drives the condensation of CdTe vapor on the substrate surface and thus CdTe film formation on the same. Preferably, the CdTe source temperature and the substrate temperature are held at about 500 to 550° C. and about 450 to 500° C., respectively.

The third p-type absorber layer 43 is formed of cadmium mercury telluride, $Cd_{1-h}Hg_hTe$, where h ranges from more than zero to less than one, preferably from 0.15 to 0.20. Substitution of mercury for some of the cadmium atoms decreases the band gap energy of $Cd_{1-h}Hg_hTe$ to less than 1.5 eV for the CdTe binary compound. Therefore, the preferred band gap energy of 1.0 eV to 1.2 eV for the third absorber layer 43 can be attained by substituting mercury for 15 to 20% of the cadmium atoms in the film. The $Cd_{1-h}Hg_hTe$ absorber layer 43 has a preferred thickness of about 5 nm to 200 nm and can be deposited by sputter deposition, wherein the substrate temperature is held at about 200 to 450° C.

The back contact 45 has a bilayer structure, wherein the first layer disposed in contiguous contact with the third absorber layer 43 is copper and the second layer is nickel or gold. The copper in contact with $Cd_{1-h}Hg_hTe$ absorber 43 diffuses therein upon subsequent annealing at about 100 to 250° C. and replaces some of the Cd or Hg atoms in $Cd_{1-h}Hg_hTe$, thereby increasing p-type dopant concentration and thus decreasing the contact resistance. However, copper is prone to diffuse across the entire absorber layers 39-43 and to cause shorting if excess amount of copper is deposited. Therefore, the thickness of the copper layer is such that just enough copper is present to diffuse into the top surface of the absorber for establishing a low resistance contact. The copper layer thickness should not exceed about 7 nm. Preferably, the copper layer thickness is about 0.5 nm to 5 nm. The copper layer of the back contact 45 may be deposited onto the third absorber layer 43 by magnetron sputtering or evaporation. The second layer of the back contact 45 made of gold or nickel, which serves as the main current collector, has a thickness of more than 0.1 μm and may be deposited onto the first copper layer by magnetron sputtering or evaporation.

Another appropriate bilayer structure for the back contact 45 comprises a first layer made of copper doped zinc telluride (ZnTe:Cu) and a second layer made of titanium (Ti), wherein the first ZnTe:Cu layer is in contiguous contact with the third absorber layer 43.

It should be noted that the present invention can also be advantageously applied to a photovoltaic device having two or more absorber layers in contiguous contact. A photovoltaic device including two contiguous absorber layers, for example, may have band gap energies of 1.7 eV and 1.1 eV for the first and second absorber layers, respectively. Similarly, a photovoltaic device including four contiguous absorber layers may have band gap energies of 1.8 eV, 1.5 eV, 1.2 eV and 1.0 eV for the first, second, third and fourth absorber layers, respectively.

Fabrication of the illustrated photovoltaic device of FIG. 2 will now be described. The processing starts by depositing a doped TCO layer for the front contact 33 onto the substrate 31 by sputter deposition or chemical vapor deposition. A thin secondary TCO layer 35 made of an undoped TCO material is deposited onto the front contact 33. A first scribing step is applied over the entire width of the substrate 31 to pattern the front contact circuit and to isolate individual cells by laser or a mechanical means as well known to one of skill in the art. The scribing cuts have to be as narrow as possible, i.e. 100 μm range, and are spaced apart by 5 to 10 mm. The n-type window layer 37 made of CdS or ZnS is then deposited onto the secondary TCO layer 35 by magnetron sputtering at a temperature in the range of 200° C. to 450° C. or CSS. The first p-type absorber layer 39 is deposited onto the n-type window layer 37 by evaporation or sputter deposition at a temperature in the range of 200° C. to 450° C., thereby forming a rectifying junction therebetween. The second p-type absorber layer 41 made of CdTe is deposited onto the first absorber layer 39 by sputter deposition at a temperature in the range of 200° C. to 450° C., CSS or a physical vapor deposition method in which the CdTe vapor for forming the CdTe film is generated by sublimation of a solid CdTe source. The third p-type $Cd_{1-h}Hg_hTe$ absorber layer 43 is deposited onto the second CdTe absorber layer 41 by sputter deposition at a temperature in the range of 200° C. to 450° C. or evaporation. A thin layer of $CdCl_2$ is sputter deposited or evaporated onto the surface of the third absorber 43, which is followed by a 20 to 30 minute annealing at about 415° C. to diffuse chlorine from $CdCl_2$ film into the absorber layers 39-43, thereby increasing p-type doping and crystal grain size thereof. A second scribing step, which cuts through the absorber layers 39-43 and the window layer 37, is then applied over the entire width of the substrate 31 to pattern the interconnect between adjacent cells by laser or a mechanical means as well known to one of skill in the art. The forming of the back contact 45 on the third absorber layer 43 comprises depositing a thin layer of copper and a layer of nickel or gold sequentially and annealing the copper/nickel or copper/gold at a temperature ranges from 100 to 250° C. to diffuse copper into the absorber, thereby increasing the p-type doping of the absorber. A third scribing step, which cuts through the back contact 45, the absorber layers 39-43 and the window layer 37, is then applied over the entire width of the substrate 31 to pattern the back contact circuit and to isolate adjacent cells by laser or a mechanical means. After the steps described above, the device of FIG. 2 is subjected to the final backend processing of cell encapsulation and module packaging.

While the present invention has been shown and described with reference to certain preferred embodiments, it is to be understood that those skilled in the art will no doubt devise certain alterations and modifications thereto which nevertheless include the true spirit and scope of the present invention. For example, the three contiguous absorber layer structure described above may be substituted by a two or four layer structure without departing from the scope of the invention. Thus the scope of the invention should be determined by the appended claims and their legal equivalents, rather than by examples given.

What is claimed is:

1. A heterojunction photovoltaic device comprising:
    an optically transparent substrate for receiving incident light;
    a front contact formed of a transparent conductive oxide disposed on the side of said optically transparent substrate opposite incident light;
    an n-type window layer having a band gap energy of at least 2.2 eV disposed on said front contact;
    a p-type absorber structure deposited contiguously onto said n-type window layer, wherein said p-type absorber structure comprises three absorber layers in sequential touching contact, a first absorber of said three absorber layers is selected from the group consisting of CdSe, $Cd_{1-y}Mg_yTe$, $Cd_{1-y}Mn_yTe$ and $Cd_{1-y}Zn_yTe$, where y ranges from about 0.05 to about 0.20, a second absorber layer of said three absorber layers is CdTe and a third absorber layer of said three absorber layers is $Cd_{1-z}Hg_zTe$, where z ranges from about 0.15 to about 0.20, the first absorber layer is in contiguous contact with said n-type window layer, the band gap energy progressively decreases from the first absorber layer to the last absorber layer; and
    a back contact formed on the last absorber layer of said p-type absorber structure.

2. The photovoltaic device of claim 1 wherein said n-type window layer is CdS or $Cd_{1-x}Zn_xS$, where x ranges from more than zero to no more than one.

3. The photovoltaic device of claim 1 wherein said front contact is aluminum doped zinc oxide or fluorine doped tin oxide.

4. The photovoltaic device of claim 1 further comprising a secondary transparent conductive oxide layer interposed between said front contact and said n-type window layer, wherein said secondary transparent conductive oxide layer is selected from the group consisting of zinc stannate, zinc oxide and tin oxide.

5. The photovoltaic device of claim 1 wherein said back contact comprises a first layer of copper in contiguous contact with said third absorber layer of said p-type absorber structure and having a layer thickness of not more than 7 nm and a second layer of a conductive metal disposed thereon, said conductive metal is nickel or gold.

6. The photovoltaic device of claim 1 wherein said back contact comprises a first layer of copper doped zinc telluride in contiguous contact with the third absorber layer of said p-type absorber structure and a second layer of titanium deposited on said first layer of copper doped zinc telluride.

* * * * *